United States Patent [19]

Arakawa et al.

[11] Patent Number: 4,782,298
[45] Date of Patent: Nov. 1, 1988

[54] MRI QD RF COIL HAVING DIODE SWITCHED DETUNING CIRCUIT PRODUCING REDUCED ARTIFACT

[75] Inventors: Mitsuaki Arakawa, Hillsborough; Barry M. McCarten, Los Altos, both of Calif.

[73] Assignee: The Regents of the University of California, Berkeley, Calif.

[21] Appl. No.: 91,916

[22] Filed: Sep. 1, 1987

[51] Int. Cl.[4] .................................... G01R 33/20
[52] U.S. Cl. ...................................... 324/322; 324/318
[58] Field of Search ............... 324/318, 319, 320, 322, 324/311, 309, 307; 333/219, 235, 181

[56] References Cited

U.S. PATENT DOCUMENTS 4,620,155 10/1986 Edelstein .............................. 324/322
4,649,348 3/1987 Flugan ................................. 324/318
4,717,881 1/1988 Flugan ................................. 324/322

Primary Examiner—Stewart J. Levy
Assistant Examiner—Kevin D. O'Shea
Attorney, Agent, or Firm—Nixon & Vanderhye

[57] ABSTRACT

A detuning/decoupling arrangement for a Magnetic Resonance Imaging (MRI) system quadrature RF coil arrangement (of the type using the nuclear magnetic resonance, or NMR, phenomenon) uses switching diodes to selectively connect and disconnect portions of a segmented RF coil in response to a DC control signal. The DC control signal selectively forward biases and reverse biases the switching diodes. The DC control current flows through the RF coil itself, through the diodes, and then through the center conductor of a semi-rigid transmission line disposed in proximity to the RF coil. Because the DC current flowing through the transmission line is equal and opposite to the DC current flowing through the RF coil, the net magnetic field generated by the DC current flow is approximately zero—eliminating artifacts in the MRI image that would otherwise be generated due to continuous DC current flowing whenever the coil is being used to transmit or receive RF.

21 Claims, 3 Drawing Sheets

MRI QD RF COIL HAVING DIODE SWITCHED DETUNING CIRCUIT PRODUCING REDUCED ARTIFACT

This invention is related to the field of magnetic resonance imaging (MRI) utilizing nuclear magnetic resonance (NMR) phenomenon. It is particularly related to an advantageous selectively detunable RF coil for an MRI system.

This application is generally related to the following commonly-assigned patents of Crooks et al; U.S. Pat. Nos. 4,297,637; 4,318,043; 4,471,305 and 4,599,565. These prior issued patents disclose MRI systems which produce images using the spin echo nuclear magnetic resonance phenomenon.

Quadrature ("QD") RF excitation and reception in NMR (nuclear magnetic resonance) imaging applications is generally known (see, e.g., commonly-assigned copending application Ser. No. 893,889 of Arakawa et al filed Aug. 6, 1986). Such quadrature arrangements provide many advantages, including reduced levels of RF power deposition for a given transmitted RF pulse duration, and improved signal-to-noise ratio.

It may be desirable to use different quadrature (or other) RF coils for receive and transmit. For example, a large "body" coil may be used to generate a RF field in and around the entire body of a subject to be imaged, and smaller coils (e.g., coils surounding the head or other body portion to be imaged) may then be used to receive. Such arrangements provide great flexibility, since the same quadrature body coil may always be used for transmit, and different receive coils may then be used depending upon the type of images desired (e.g., the body coil can be used to receive if an overall image of a large portion of the subject is desired, a smaller "head coil" surrounding the head of a subject may be used for detailed imaging of the subject's head, or a "surface coil" may be used for imaging other specific body portions such as the chest area).

It is generally known to detune the transmit body coil during the time another coil receives the resulting RF echo pulses. See, for example, Misic et al, "Quadrature RF Coil And Decoupling Systems For Mid Field NMR Imaging," Vol. 1 *Book of Abstracts, Society of Magnetic Resonance in Medicine* 183 (Aug. 19, 1986). It has been recognized in the past that when separate quadrature coils are used for transmit and receive, it is necessary to decouple the receive coil system during the transmit portion of the pulse sequence, and to decouple the transmit coil during the receive portion of the sequence. Detuning the transmit coil during reception by a head or surface coil reduces, but does not entirely eliminate, artifacts and signal loss during receive. It is therefore known to actively open-circuit each loop of the body coil using PIN diodes whenever a head or surface coil is being used for reception (see the Misic et al paper cited above). Misic et al have determined that the results obtained from this type of arrangement compare favorably with the results obtained from independent single coil probe quadrature head and body coils.

We have discovered, however, that significant artifacts may be generated by the magnetic fields produced by the DC control current used to activate such PIN switching diodes. Although this DC control current may have an amplitude of only a few amperes, the current flow generates a magnetic field (e.g., in the z axis) which at least locally may interfere with the gradient magnetic field needed for proper NMR imaging. More particularly, this DC magnetic field typically generates a so-called "artifact" disturbance in the image which degrades image quality and may render positions of the image unclear. In addition, undesirable eddy currents may flow over the DC current path in response to the strong pulsating gradient magnetic fields. These eddy currents in turn produce magnetic fields which add to the artifacts created by the DC control current field.

We have now developed a unique coil decoupling arrangement using switching diodes which produces virtually no DC magnetic field and associated artifacts.

The present invention provides an RF coil having a discontinuity or "gap," with one or more switching devices (e.g., diodes) connected across the gap. The diodes provide a conduction path for RF when they are forward biased by a DC control signal, and open-circuit the RF coil loop when reverse-biased. The DC control signal flows through the RF coil to the diodes, and returns through a DC path within a section of transmission line in proximity to the RF coil. Because equal amounts of DC current flow through the RF coil and through the transmission line, balanced (equal and opposite) DC magnetic fields are generated which cancel one another to leave substantially no net DC magnetic field (thus reducing or entirely eliminating image artifacts which would otherwise be generated by the DC current flow). RF traps provided close to each end of the transmission line prevent RF from being conducted within the line.

Flow of DC control currents through the transmission line(s) used in the preferred embodiment of the present invention does not produce undesirable image artifacts due to spurious magnetic fields because generated magnetic fields are fully balanced and cancelled by equal and opposite magnetic fields generated by DC currents flowing through the nearby RF coil. In addition, the DC conductors within the transmission lines are isolated from RF signals, providing good isolation between the DC and RF circuits even though both DC and RF signals flow though the RF coil—and eliminating the need for additional RF traps or other isolation devices.

The transmission line outer conductors are conductively bonded to the RF coil surfaces in the preferred embodiment in order to minimize mechanical vibration and provide mechanical strength as well as low resistance electrical connections. Some gaps in the RF coil of the preferred embodiment of the present invention have switching diodes connected across them—these gaps allow coil detuning/decoupling in response to a DC control signal. Other coil gaps in the preferred embodiment have DC blocking/RF coupling capacitors connected across them, these gaps limiting the DC control signal path and also reducing eddy currents which might flow through the coil in response to the pulsating gradient magnetic fields.

These and other features and advantages of the present invention will be better and more completely understood by referring to the following detailed description of presently preferred exemplary embodiments in conjunction with the appended sheets of drawings, of which:

Figure 1:
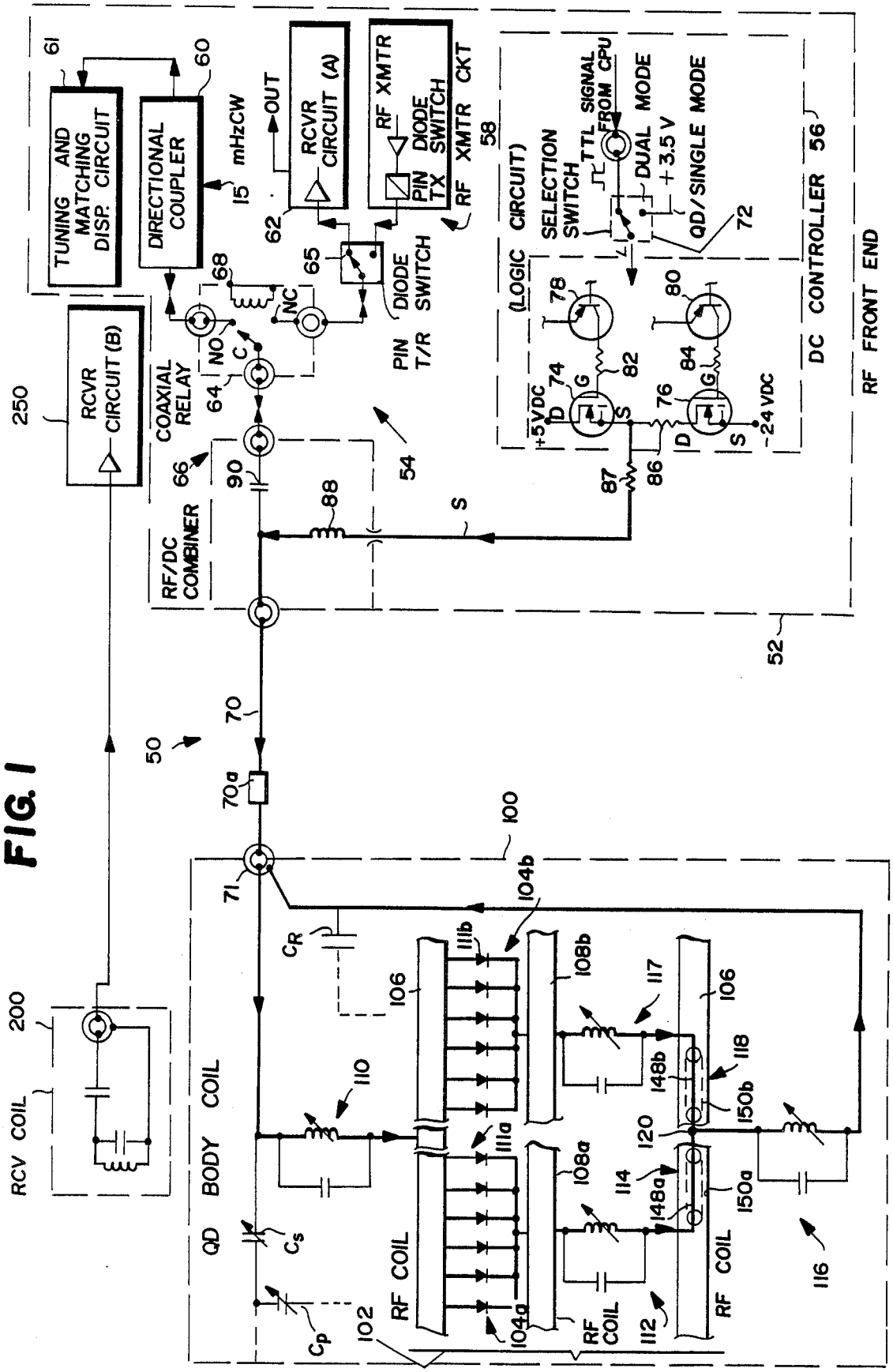
FIG. 1 is an overall schematic diagram of an MRI system including a presently preferred exemplary embodiment of an RF coil arrangement and associated RF front end in accordance with the present invention.

FIG. 1 is a schematic diagram of the presently preferred exemplary embodiment of a MRI system 50 in accordance with the present invention. MRI system 50 includes an RF front end 52 and a quadrature body coil arrangement 100.

As will be explained, coil arrangement 100 includes switching devices which complete a resonant RF circuit (and thus make the coil arrangement operational) in response to a DC control signal S provided by front end 52. When this positive DC control signal S is present, coil arrangement 100 may be used for radiating RF signals provided by front end 52. Alternatively or in addition, coil arrangement 100 provides received RF signals to front end 52 when the DC control signal S is present.

During times when front end 52 does not provide a positive DC control signal to body coil 100, the body coil is detuned so as not to resonate at the RF frequency of operation, and is virtually invisible to other, resonant RF coils operating nearby—for example, receive coil 200 and associated receiver 250 (since coil arrangement 100 does not provide a complete RF circuit in the preferred embodiment when the coil arrangement is detuned).

In the preferred embodiment, front end 52 includes an RF section 54 and a DC controller section 56. RF section 54 includes an RF transmitter 58, an RF receiver 62, a coaxial relay switch 64, a PIN diode T/R switch ("transmit/receive") 65, an RF/DC combiner circuit 66, a directional coupler 60, and a tuning and matching display circuit 61.

RF transmitter 58 produces high-power RF signals (having a frequency of about 15 MHz in the preferred embodiment) which pass through T/R switch 65 to the normally closed contact NC of relay 64. RF receiver 62 detects RF signals present on the relay 64 normally closed contact NC and passed to the receiver via T/R switch 65, and provides an output signal OUT which is further processed (using conventional MRI signal processing techniques) to produce images.

T/R switch 65 causes a signal path to be created between RF transmitter 58 and RF/DC combiner circuit 66 (via the relay 64 normally closed contact NC) whenever system 50 is in a transmit mode. During receive, T/R switch 65 creates a signal path between RF/DC combiner circuit 66 and the RF input of receiver 62 (also via the relay normally closed contact NC).

The relay 64 normally open (NO) contact is connected to a directional coupler 60 and associated tuning and matching display circuit 61—which are used to initially tune (resonate) coil arrangement 100 prior to detecting image signals. Relay coil 68 is energized during initial system setup so that coupler 60 and display circuit 61 can be used for initial tuning of coil arrangement 100—and is then de-energized during normal system operation.

DC controller 56 selectively produces DC control signal S which combiner circuit 66 multiplexes with RF signals and applies to a coaxial RF cable 70 (type RG-214 in the preferred embodiment) connecting front end 52 with coil arrangement 100. RF cable 70 in the preferred embodiment includes an RF trap circuit 70a (a "coaxial shielded choke") of the type described in commonly assigned issued U.S. Pat. No. 4,682,125 to Harrison et al to prevent unwanted spurious secondary RF fields from propagating over and transmitting from the outside (outer conductor) of the cable.

Controller 56 in the preferred embodiment alternately provides either +2 VDC or −24 VDC to combiner circuit 66—depending upon the setting of a selection switch 72 and also upon whether system 50 is transmitting or receiving. If coil arrangement 100 is being used for both transmit and receive, controller 56 produces a constant +2 VDC—controlling coil arrangement 100 to continuously provide a resonant RF circuit. If coil arrangement 100 is being used for transmit only (and coil 200 is being used for receive), on the other hand, controller 56 produces −24 VDC at all times except when RF transmitter 58 actually produces an RF signal.

In the preferred embodiment, controller 56 includes MOSFETs 74, 76, bipolar junction transistors 78, 80, and resistors 82, 84, 86, 87. The drain of MOSFET 74 is connected to +5 VDC in the preferred embodiment, and the source of this MOSFET is connected through series resistor 86 to the drain of MOSFET 76. The source of MOSFET 76 is connected to −24 VDC in the preferred embodiment. Control line S is connected to the srouce of MOSFET 74 through a current limiting resistor 87.

The gate of MOSFET 74 is connected through series resistor 82 to the collector of driver transistor 78, and the gate of MOSFET 76 is connected through resistor 84 to the collector of driver transistor 80. Transistors 78, 80 form part of a conventional level converter/logic circuit (not shown) which alternately turns on MOSFETs 74, 76 in response to the control signal level L at the output of switch 72.

In particular, when signal level L is at logic level 1, MOSFET 74 turns ON and MOSFET 76 turns OFF—causing approximately +2 VDC to appear on DC control signal line S. When signal level L is at logic level 0, on the other hand, MOSFET 74 is turned OFF and MOSFET 76 is turned ON to cause approximately −24 VDC to appear on DC control signal line S. RF choke 88 prevents RF signals produced by transmitter 58 or received by coil arrangement 100 over cable 70 from flowing into controller 56, but allows the DC control signal S to flow into combiner circuit 66 and over the cable. DC blocking capacitor 90 prevents the DC control signal S from flowing into relay switch 64.

In the preferred embodiment, body coil arrangement 100 defines both a resonant RF path and a DC path—these two paths being co-extensive for part but not all of their lengths.

RF produced by RF transmitter 58 flows through the switch 65, relay 64, DC blocking capacitor 90 and coaxial cable 70 into coil arrangement 100, and then flows through a series tuning capacitor $C_S$ and a parallel tuning capacitance $C_p$ into RF coil 102 (the connections between series tuning capacitor $C_S$, parallel tuning capacitance $C_p$, and the RF coil are shown schematically by a dotted line in FIG. 1). A return coupling capacitor $C_R$ RF couples the outer conductor of connector 71 to RF coil 102, but prevents DC current from flowing from the coil 102 into the connector outer conductor.

As will be understood by those skilled in the art, the inductive reactance of RF coil 102 and the capacitive reactances of tuning capacitors $C_s$ and $C_p$ form a resonant RF circuit at the common operating frequency of RF transmitter 58 and RF receiver 62. RF signals received by this resonant circuit flow back over cable 70 and through combiner circuit 66, the T/R switch 65, and relay 64 to receiver 62.

In the preferred embodiment, RF coil 102 includes discontinuities or gaps 104a, 104b defined between an RF coil section 106 and coil sections 108a, 108b. A bank of PIN diodes 111a (type UM-4902C or KS-1001 in the preferred embodiment) is connected across discontinuity 104a, with the anodes of each diode being connected to first coil portion 106 and the cathodes of each diode being connected to second coil portion 108a.

Diodes 111a are used to selectively connect and disconnect coil portions 106, 108 in the preferred embodiment. When diodes 111a are back-biased, they act as open circuits to RF (and DC) and cause coil portion 106 to be electrically disconnected from coil portion 108. When diodes 111a are forward-biased, on the other hand, RF can flow through the diodes, coil portions 106, 108 are electrically connected together, and discontinuity 104 is effectively eliminated.

In the preferred embodiment, RF coil 102 and tuning capacitors $C_s$ and $C_p$ form a resonant RF circuit only when diodes 111 are forward-biased. When diodes 111 are reverse-biased, no RF can flow from RF coil portion 106 over discontinuity 104 to RF coil portion 108, and the RF coil 102 becomes non-resonant (and thus virtually invisible to other nearby resonant RF coils such as receive coil 200).

The DC current path through RF coil arrangement 100 will now be described. The center conductor of RF coaxial cable 70 is connected (through a conventional RF connector 71 in the preferred embodiment) to one end of an RF trap 110 in addition to being connected to series tuning capacitor $C_s$ and parallel tuning capacitor $C_p$. DC control signal S is blocked by tuning capacitors $C_s$, $C_p$ but passes easily through trap 110 and flows into RF coil first section 106. RF trap 110 presents a very high impedance to RF signals present on tuning capacitors $C_s$, $C_p$ and RF cable 70 center conductor, however, preventing RF from flowing through the trap into coil portion 106.

If the voltage of DC control signal S exceeds the diode cut-in voltage (e.g., about 0.7 VDC), the diodes 111a become forward biased and conduct RF as well as DC currents. Consequently, when the voltage of DC control signal S is in the positive state (about +2 VDC is preferred), the DC control signal forward-biases the diodes in bank 111a and DC current (several amperes) flows through those diodes into second coil RF section 108a. The DC current flows from coil second section 108a through RF trap 112 into semi-rigid transmission line section 114; flows through the center conductor 148a of transmission line section 114 into trap 116; and flows from trap 116 into the outer conductor of transmission cable 70.

Current flowing through similarly forward-biased diode bank 111b between RF coil sections 106, 108b flows through a further RF trap 117, through another semi-rigid transmission line section 118 center conductor 148b, and through trap 116 to the ground conductor of RF cable 70.

In the preferred embodiment, semi-rigid transmission line 114 includes a center conductor 148a surrounded by dielectric insulation, the insulation being encased within a tubular semi-rigid copper outer conductor 150a. Simularly, semi-rigid transmission line 118 includes a center conductor 148b encased by dielectric and outer conductor 150b. The center conductors 148a, 148b of semi-rigid transmission lines 114, 118 are connected together at node 120, and trap 116 is also connected to that node. Traps 112, 116, 117 prevent RF signals from entering semi-rigid lines 114, 118—so that only the DC control signal flows through the transmission line center conductors 148a, 148b.

Figure 2:
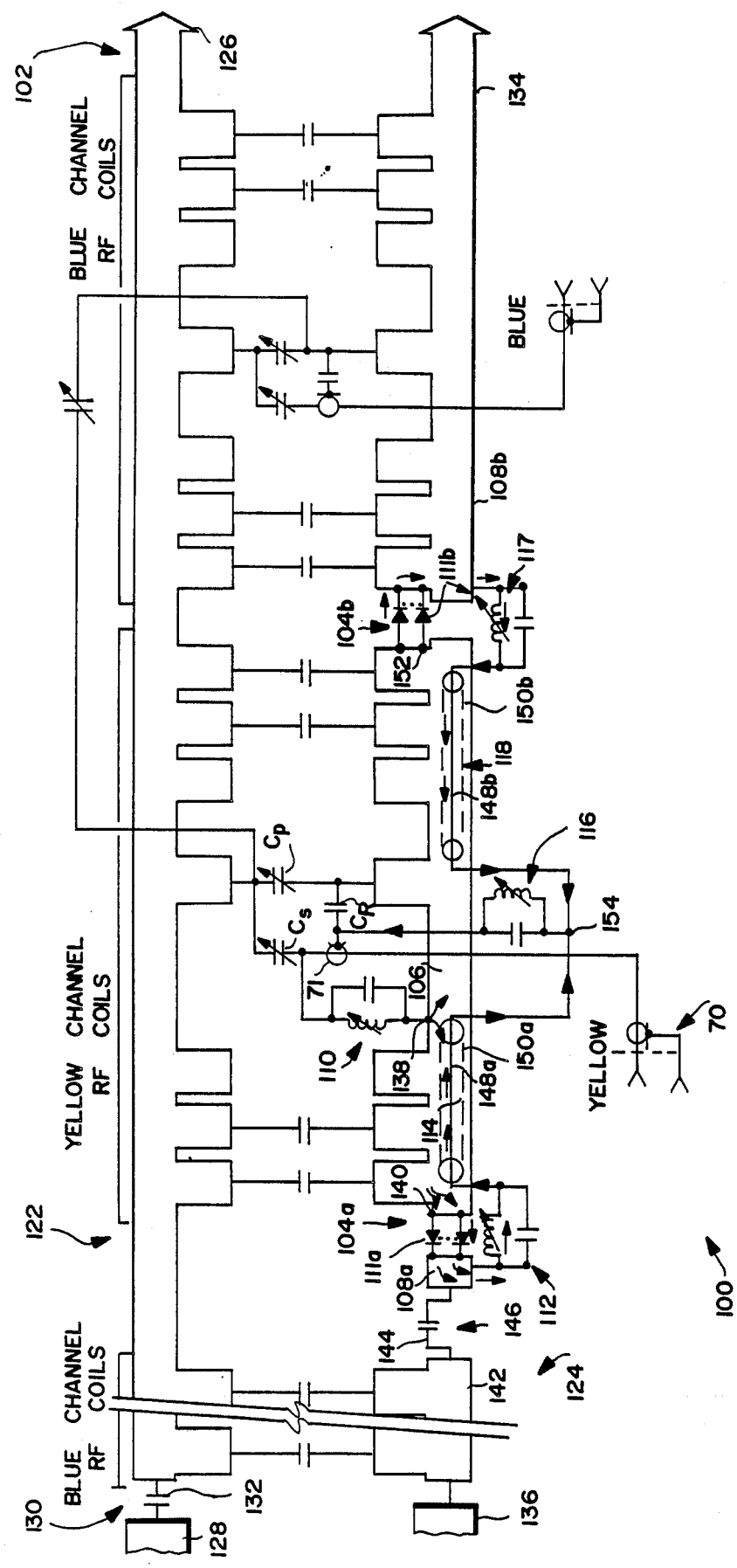
FIG. 2 is a detailed schematic diagram of the presently preferred exemplary quadrature body coil arrangement shown in FIG. 1.

FIG. 2 is a more detailed schematic diagram of coil arrangement 100. In the preferred embodiment, RF coil 102 is a quadrature saddle type circular RF coil having an upper portion (band) 122 and a lower portion (band) 124 (see copending commonly-assigned application Ser. No. 893,889, now U.S. Pat. No. 4,740,752, of Arakawa entitled "Non-overlapping QD MRI RF Coil" filed Aug. 6, 1986 for a detailed discussion of one exemplary body coil arrangement)—these upper and lower portions forming axially spaced apart annular members lying about the circumference of a common cylinder. Upper portion 122 is shown linearly in FIG. 2, but in the preferred embodiment is actually wrapped around in a circle (annulus) so that coil end 126 is mechanically and electrically connected to coil end 128. Upper coil section 122 defines a gap 130, and a series DC blocking-/coupling capacitor 132 couples RF current across the gap—permitting RF to flow in a continuous loop around coil upper portion 122 but preventing DC currents from flowing around the loop (and also tending to reduce eddy currents otherwise induced into the structure at audio frequencies due to pulsating magnetic gradient fields present within typical magnetic resonance imaging systems). As will be explained, DC blocking/coupling capacitor 132 (and other similar capacitors connected across other gaps in the coil 102) direct DC control signal S to flow over a predetermined paths—thereby enabling the magnetic fields generated from such DC current flow to be cancelled.

In a similar manner, lower coil portion end 134 is electrically and mechanically connected to lower coil portion end 136 so that the lower coil portion forms an essentially contiuous loop with gaps or discontinuities 104a, 104b, 146 breaking the loop. Diode bank 111a is connected across discontinuity 104a and diode-bank 111b is connected across discontinuity 104b to permit RF signals to flow between coil section 106 and coil sections 108a, 108b whenever (only when) the diodes are forward-biased by DC control signal S. A DC blocking/coupling capacitor 144 is connected across gap 146 to permit RF but not DC (or eddy current) to flow around the loop.

Trap 110 is directly connected to coil section 106 at a node or terminal 138. The anodes of diodes 111a are connected to coil section 106 at node 140. When the negative (−24 VDC) DC control signal level is present, the diodes 111a are reverse biased and no DC or RF currents may flow through them. This −24 VDC level is used in the preferred embodiment because it is not so negative as to cause shock hazards to human operators, but is sufficiently negative to ensure isolation through the diodes (the "barrier" or "transition" capacitance of a back-biased diode decreases with increasing reverse voltage), and to ensure reverse biasing despite spurious differences in potential which may exist between coil sections 106, 108a, 108b due to RF pickup, eddy current flow, or other effects.

Whenever the positive (+2 VDC) DC control signal is present, DC current flows from trap 110 into coil section 106 at node 138, flows through RF coil section 106 between nodes 138, 140, and then flows through diodes 111a (the positive DC control signal voltage creates a positive voltage differential across gap 104a to forward-bias the diodes).

Even though diodes 111a are directly connected to RF coil section 108a, the DC current flowing through diodes 111a is prevented from flowing from coil section 108a into further sections of the coil (e.g., coil section 142) by DC blocking/coupling capacitor(s) 144 connected across gap 146 between the coil sections. Diodes 111a are unidirectional devices and therefore do not permit DC current to flow in a reverse direction from coil section 108a to coil section 106. Due to the structure of coil 102 and to the placement of DC blocking/coupling capacitor 144, the only return path for the DC current is through trap 112 connected to the cathodes of diodes 111a (which presents a relatively small resistance to DC current) and into the center conductor 148a of semi-rigid transmission line 114.

DC blocking/coupling capacitor 144 in the preferred embodiment may be six parallel-connected 3000 pF type UFP1-302J capacitors—providing a capacitance large enough to pass higher frequency RF signals but small enough to prevent lower frequency eddy currents and DC control currents from flowing between coil sections 108a, 142. In addition, return capacitor $C_R$ connected between coil section 106 and the outer conductor of input connector 71 prevents the DC control signal S from simply flowing from cell section 106 directly into the cable 70 outer conductor (while still providing good RF coupling between coil section 106 and the cable outer conductor).

Semirigid transmission line 114 outer conductive copper shield portion 150a is soldered (or otherwise conductively bonded) to RF coil section 106 substantially along the direct line path between nodes 138, 140. That is, transmission line 114 is physically disposed on the surface of coil section 106 on the same path along which DC current flows through the coil between trap 110 and diodes 111a. Because the transmission line outer conductor 150a is electrically bonded to the surface of coil section 106, some of the DC current flowing between nodes 138, 140 actually may flow through the transmission line outer conductor (and, of course, RF currents flow through the transmission line outer conductor whenever RF is present on the RF coil). The magnetic field produced by the DC current flowing through RF coil section 106 (and semi-rigid line 114 outer conductor 150a) between nodes 138, 140 surrounds the semi-rigid line inner conductor 148a (the semi-rigid line, being made out of copper, is non-magnetic).

Transmission line inner conductor 148a is electrically insulated from the line outer conductor 150a by dielectric (air or any other insulator can be used). No electrical connections exist between traps 112, 116 and coil section 106 in the preferred embodiment. Since equal amounts of DC current must flow into and out of diodes 111a, the DC current flowing through semi-rigid line center conductor 148a has a magnitude exactly equal (neglecting losses due to DC resistance) to the magnitude of DC current flowing through coil section 106 (and semi-rigid line outer conductor 150a) between nodes 138, 140, and flows in a direction which is opposite to the direction in which that current flows between nodes 138, 140.

The current flowing through semi-rigid line 114 center conductor 148a therefore produces a magnetic field which is substantially equal in magnitude and opposite in direction to the magnetic field produced by the DC current flowing through said section 106 between nodes 138, 140, and these two equal and opposite (that is, balanced) magnetic fields exist in essentially the same space. The equal and opposite magnetic fields virtually completely cancel one another to leave a zero net magnetic field—even though several amperes of DC current may be continuously flowing through diodes 111a trap 112, semi-rigid line 114 center conductor 148a, and trap 116.

Additional gap 104b and associated switching diodes 111b are provided in coil 102 in the preferred embodiment because coil 102 is a quadrature coil and therefore has two resonant sections (yellow and blue in the preferred embodiment) which must be disabled. In a manner similar to that described above, DC current flows from node 138 through RF coil section 106 to node 152 connected to diodes 111b. When the DC control signal S has a positive level, DC current flows from node 152 into the anodes of forward-biased diodes 111b and through the diodes.

Although the cathodes of diodes 111b are directly connected to coil section 108b, this coil section is not DC coupled to any other structure except for trap 117 (DC blocking/coupling capacitor 144 prevents DC current from flowing through coil section 108b around the coil loop into coil section 108a). Therefore, all of the DC current flowing through diodes 111b flows into trap 117. The other side of the trap 117 is connected to semi-rigid transmission line section 118 center conductor 148b, the other end of the center conductor being connected to trap 116 (and also to the center conductor 148a of transmission line section 114) at node 154. Semi-rigid line 11 outer conductor 150b is soldered to coil section 106, and line 118 is physically and mechanically located on the surface 160 of RF coil section 106 substantially along the direct line current path between nodes 138, 152 in the preferred embodiment. The current flowing through transmission line 118 center conductor 148b produces a magnetic field having a magnitude which is approximately equal to the magnitude of the magnetic field generated by the DC current flowing between nodes 138 and 152, but which is opposite in direction to that other magnetic field. These two magnetic fields cancel one another to leave a net magnetic field of approximately zero.

Figure 3:
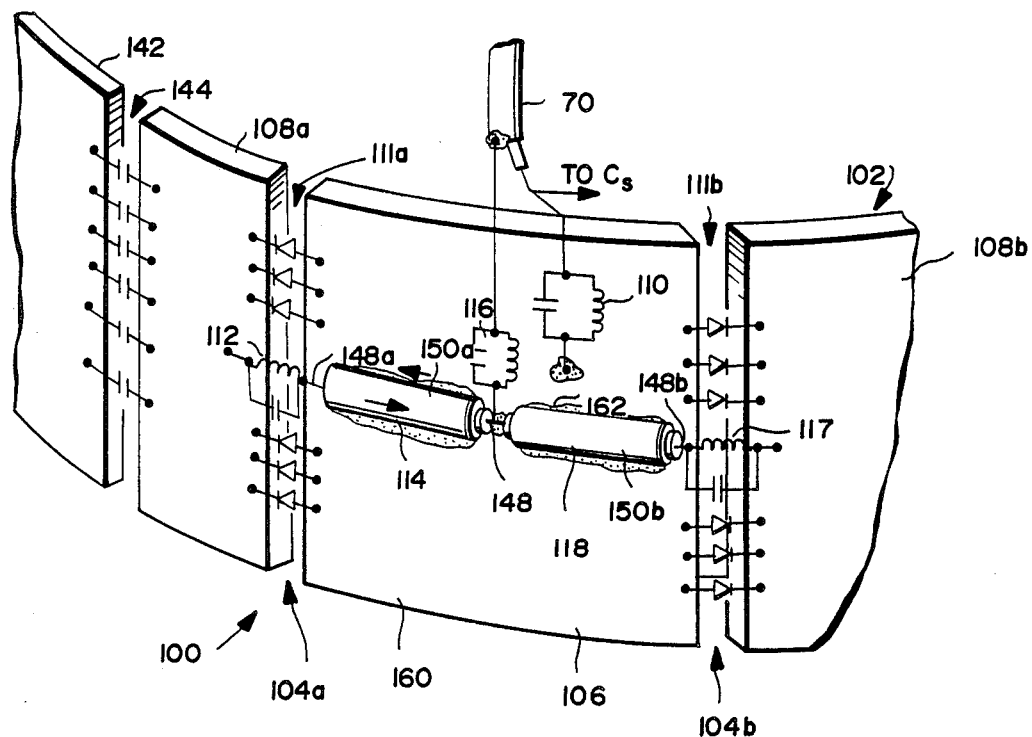
FIG. 3 is a side perspective view of the DC control current feed structure of the coil arrangement shown in FIG. 2.

FIG. 3 is a detailed perspective and schematic diagram of coil arrangement 100 showing the mechanical and electrical connections between semi-rigid transmission line sections 114, 118 and RF coil section 106. Since coil section 106 is curved (i.e., a part of an annulus) in the preferred embodiment, transmission line sections 114, 118 are also preferably curved so as to conform in shape with the coil section outer surface 160. The solder bond 162 between transmission line outer conductors 150a, 150b and coil section outer surface 160 prevents the transmission line sections 114, 118 from vibrating at audio frequencies due to the pulsating NMR gradient magnetic fields, and also establishes a low resistance DC path between the cable outer conductors and the coil section surface 160.

The RF shielding effect provided by transmission line outer conductors 150a, 150b prevents the transmission line center conductors 148a, 148b from being exposed to RF even when large RF currents are flowing through coil 102. In particular, RF currents tend to flow along the outer surface of semi-rigid line outer conductors 150 when transmitter 58 supplies RF to coil arrangement 100, but due to the so-called "skin effect" and other well-known transmission line characteristics, very little RF reaches the center conductors 148a, 148b. The use of semi-rigid transmission line (generally used for conducting RF signals, not DC signals) for conducting and RF shielding DC control signal S eliminates the need for additional traps, shielding, DC blocking or RF bypass capacitors, and the like which might otherwise be required to prevent RF from flowing in DC conductors.

In the preferred embodiment, traps 112, 116, 117 are positioned as close as possible to the ends of semi-rigid line sections 114, 118—shortening the length of unshielded, exposed portions of line center conductors 148a, 148b. Traps 110, 112, 116 and 117 are tuned to the body coil resonant frequency (15 MHz) in the preferred embodiment. Body coil 102 generates fields perpendicular to the Z axis, and traps 110, 112, 116, 117 are each oriented so that the fields they produce are in the same direction as the Z axis—minimizing spurious coupling to the main magnetic field generated by the body coil.

Figure 4A:
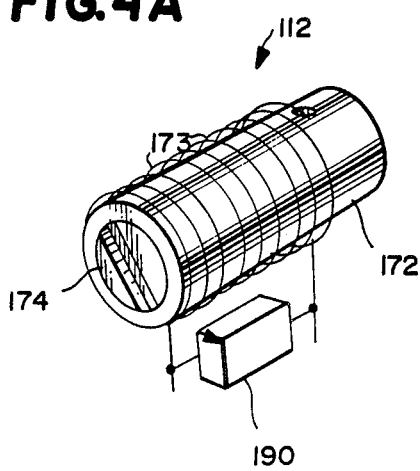
FIGS. 4A and 4B are detailed perspective and cross-sectional views, respectively, of the RF traps shown schematically in FIGS. 1-3.
Figure 4B:
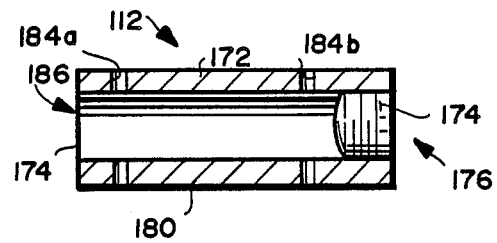

FIGS. 4A and 4B are perspective and cross-sectional views, respectively, of an exemplary RF trap design used in the preferred embodiment for traps 110, 112, 116 and 117. In the preferred embodiment, these traps are each made by winding 22 turns of 18 gauge wire 173 onto an acrylic tube 172 having an outside diameter of about ½ inch and a length of about 1¾ inches. A small threaded copper rod member 174 having a length of about ¼ inches and an outside diameter of 0.375 inches is advanced into an end 176 of tube 172 and used to tune the trap 112 to the desired resonant RF frequency (i.e., 15 MHz).

Tube 172 includes a number 50 drill hole 184a drilled into the tube end 176 which is used to start winding 173, and a further number 50 drill hole 184b drilled through the tube at a further end 186 which is used to end the winding. The resulting RF choke has an inductive reactance of about 2.4 microhenries and a DC resistance of only 0.043 ohms. A capacitor 190 of about 47 pF in the preferred embodiment is connected across winding 173 to provide a parallel RF resonance circuit. The resulting trap 112 can be precisely tuned to the desired radio frequency by advancing member 174 further into or retreating the number from tube end 176.

The present invention provides a detuning/decoupling MRI RF coil arrangement using switching diodes to selectively connect and disconnect portions of a segmented RF coil in response to a DC control signal. The DC control signal selectively forward biases and reverse biases the switching diodes. The DC control current flows through the RF coil itself (and thus shares a path with RF currents), through the diodes, and then through the center conductor of a semi-rigid transmission line disposed in proximity to the RF coil surface. Because the DC current flowing through the transmission line is equal and opposite to the DC current flowing the RF coil, the net magnetic field generated by the DC current flow is approximately zero—reducing or eliminating artifacts in the image that would otherwise be generated due to DC bias current flow.

Although the DC control current flows through the RF coil and the center conductor of an unbalanced transmission line conductively bonded to the RF coil surface in the preferred embodiment, in other applications it might be desirable to use a balanced transmission line (e.g., open wire ladder line connected directly across the switching diodes) instead. In addition, although two semi-rigid lines and two diode banks are used in the quadrature coil design of the preferred embodiment, a single line and associated diode bank can be used to decouple/detune a single loop non-quadrature type coil.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. Magnetic resonance imaging apparatus comprising:
   resonant RF circuit means for resonating at a predetermined radio frequency, said resonant circuit means including an RF coil;
   means coupled to said RF coil and also connected to a DC control signal for preventing said resonant circuit means from resonating at said predetermined frequency in response to a first DC control signal level and for drawing a DC current through said RF coil in response to a second DC control signal level, said DC current generating a first magnetic field; and
   further structure disposed in proximity to said RF coil and connected to said preventing means for generating a further magnetic field substantially cancelling said first magnetic field in response to said second DC control signal level.

2. Magnetic resonance imaging apparatus as in claim 1 wherein said further structure includes an RF transmission line.

3. Magnetic resonance imaging apparatus as in claim 2 wherein said transmission line comprises an unbalanced RF transmission line including a center conductor and an outer conductor surroundin said center conductor.

4. Magnetic resonance imaging apparatus as in claim 3 wherein said transmission line outer conductor is conductively bonded to a surface of said RF coil and said transmission line center conductor is DC coupled between said preventing means and said DC control signal.

5. Magnetic resonance imaging apparatus as in claim 4 wherein apparatus further includes an RF trap connected between an end of said transmission line center conductor and said DC control signal.

6. Magnetic resonance imaging apparatus as in claim 5 wherein said apparatus further includes a further RF trap connected between said transmission line center conductor and said preventing means.

7. Magnetic resonance imaging apparatus as in claim 4 wherein said apparatus further includes an RF trap connected between said transmission line center conductor and said preventing means.

8. Magnetic resonance imaging apparatus as in claim 1 wherein said preventing means includes at least one switching diode.

9. Magnetic resonance imaging apparatus as in claim 1 wherein:
   said RF coil defines a gap; and said preventing means includes a switching diode connected across said gap, said switching diode being forward biased in response to said second control signal level and being reverse biased in response to said first control signal level.

10. Magnetic resonance imaging apparatus as in claim 9 wherein:
said RF coil defines a further gap; and
said apparatus further includes DC blocking/RF coupling means connected across said further gap for blocking the flow of said DC control signal across said further gap and for permitting RF currents to flow across said further gap.

11. Magnetic resonance imaging apparatus as in claim 1 further including means for directing the flow of said DC control current through a predetermined portion of said RF coil in proximity to said further structure.

12. Magnetic resonance imaging apparatus comprising:
an RF coil having a gap at first and second noncontacting coil portions;
switching diode means connected between said first and second noncontacting coil portions for conducting RF currents between said first and second coil portions in response to the presence of a DC signal on said first coil portion and for conducting a DC current flowing in a first direction through said RF coil first portion in response to said DC signal presence; and
additional conductor means, disposed in proximity to said coil first portion and DC coupled to said coil second portion, for conducting a further DC current having a magnitude equal to the magnitude of said first-mentioned DC current and directing said further current to flow in a second direction opposite to said first direction.

13. Magnetic resonance imaging apparatus as in claim 12 wherein said additional conductor means comprises an unbalanced RF transmission line having a center conductor encased in an outer conductor, said center conductor being connected between said coil second portion and said DC control signal, said outer conductor being conductively bonded to a surface of said RF coil.

14. Magnetic resonance imaging apparatus as in claim 13 further including a first resonant RF trap connected between said transmission line center conductor and said DC control signal, and a second resonant RF trap being connected between said transmission line center conductor and said coil second portion.

15. Magnetic resonance imaging apparatus as in claim 14 wherein said first and second RF traps are oriented with respect to said coil surface such that fields produced by said RF traps lie in a different direction from fields produced by said RF coil.

16. Magnetic resonance imaging apparatus as in claim 12 wherein:
said RF coil has a further gap at third and fourth non-contacting portions; and
said apparatus further includes means connected across said further gap for coupling RF across said further gap and for preventing said DC control current from flowing across said further gap.

17. Magnetic resonance imaging apparatus as in claim 12 wherein said apparatus further includes input/output means for coupling RF signals to/from said RF coil, said input/output means also for connecting said DC control signal to said coil first portion.

18. Magnetic resonance imaging apparatus as in claim 17 further including an RF trap means connected between said input/output means and said coil first portion for permitting said DC control signal to flow between said input/output means and said RF coil first portion and for preventing RF signals from flowing directly between said input/output means and said coil first portion.

19. Magnetic resonance imaging apparatus as in claim 18 further including DC blocking/coupling capacitor means connected between said input/output means and said coil second portion for permitting RF signals to flow between said input/output means and said coil second portion and for preventing said DC control signal from flowing directly between said input/output means and said coil second portion.

20. A magnetic resonance imaging apparatus comprising:
resonant RF circuit means for resonating at a predetermined radio frequency, said resonant circuit means including an RF coil;
means DC coupled to said RF coil for preventing said circuit means from resonating at said predetermined frequency in response to a DC control current flowing in a first direction through said RF coil; and
means connected to said preventing means for balancing said current flowing through said RF coil with a further current substantially equal in magnitude to the magnitude of said first-mentioned current and flowing in a second direction opposite to said first direction.

21. A magnetic resonance imaging apparatus comprising:
resonant RF circuit means for resonating at a predetermined radio frequency, said resonant circuit means including an RF coil shaped in a loop having first and second discontinuities therein;
DC blocking/RF coupling means connected across said first coil discontinuity for preventing DC currents from flowing around said loop and for permitting RF currents to flow across said first coil discontinuity;
switching diode means, connected across said coil second discontinuity and operating alternately in a forward biased and in a back-biased state in response to DC voltage differentials across said first coil discontinuity, for preventing RF currents from flowing across said second coil discontinuity when operating in said reverse-biased state and for permitting RF currents to flow across said second discontinuity when in said forward-biased state;
DC control means for alternately producing first and second voltage levels between first and second terminals;
means for coupling said first terminal to said RF coil at one side of said second discontinuity; and
further structure, disposed in proximity to said RF coil and connected to said RF coil at the other side of said second discontinuity, for balancing the DC current flowing in a first direction through said RF coil along a first path from said first terminal coupling means to said switching diode means with a further current substantially equal in magnitude to the magnitude of said first-mentioned DC current and for causing said further current to flow in a second direction opposite to said first direction from said switching diode means to said second terminal along a further path substantially parallel to said first path.

* * * * *